(12) United States Patent
Ha et al.

(10) Patent No.: US 7,456,041 B2
(45) Date of Patent: Nov. 25, 2008

(54) MANUFACTURING METHOD OF A MEMS STRUCTURE, A CANTILEVER-TYPE MEMS STRUCTURE, AND A SEALED FLUIDIC CHANNEL

(75) Inventors: Byeoung-ju Ha, Seongnam-si (KR); Chang-seung Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 413 days.

(21) Appl. No.: 11/301,032

(22) Filed: Dec. 13, 2005

(65) Prior Publication Data

US 2006/0166393 A1 Jul. 27, 2006

(30) Foreign Application Priority Data

Jan. 24, 2005 (KR) .................. 10-2005-0006283

(51) Int. Cl.
*H01L 21/00* (2006.01)
(52) U.S. Cl. .......................... 438/50; 438/53
(58) Field of Classification Search ............ 438/48–53; 333/186–199; 310/324, 326, 327; 427/100; 29/25.01, 25.35; 216/2
See application file for complete search history.

(56) References Cited

U.S. PATENT DOCUMENTS

| | | | | |
|---|---|---|---|---|
| 5,242,863 A | * | 9/1993 | Xiang-Zheng et al. | 438/53 |
| 5,352,635 A | * | 10/1994 | Tu et al. | 438/53 |
| 5,736,430 A | * | 4/1998 | Seefeldt et al. | 438/53 |
| 5,801,069 A | * | 9/1998 | Harada et al. | 438/52 |
| 6,021,675 A | * | 2/2000 | Seefeldt et al. | 73/777 |
| 6,355,498 B1 | * | 3/2002 | Chan et al. | 438/48 |
| 6,762,471 B2 | * | 7/2004 | Kim | 257/414 |
| 6,803,637 B2 | | 10/2004 | Benzel et al. | |
| 7,148,077 B2 | * | 12/2006 | Fuertsch et al. | 438/53 |
| 7,195,946 B2 | * | 3/2007 | D'Arrigo et al. | 438/54 |
| 2001/0026951 A1 | * | 10/2001 | Vergani et al. | 438/52 |
| 2004/0065932 A1 | * | 4/2004 | Reichenbach et al. | 257/415 |
| 2004/0266050 A1 | | 12/2004 | Benzel et al. | |
| 2005/0026321 A1 | * | 2/2005 | D'Arrigo et al. | 438/53 |
| 2005/0134401 A1 | * | 6/2005 | Song et al. | 333/133 |
| 2007/0020628 A1 | * | 1/2007 | Francis-Lang et al. | 435/6 |
| 2007/0120625 A1 | * | 5/2007 | Larson et al. | 333/189 |
| 2007/0222336 A1 | * | 9/2007 | Grannen et al. | 310/320 |

FOREIGN PATENT DOCUMENTS

WO WO 99/45583 A1 9/1999

* cited by examiner

*Primary Examiner*—Savitri Mulpuri
(74) *Attorney, Agent, or Firm*—Sughrue Mion, PLLC

(57) ABSTRACT

A method of manufacturing a MEMS structure including forming a porous layer having a predetermined thickness on the top surface of a substrate over an area where a cavity is to be formed; forming the cavity by etching the substrate below the porous layer; forming a membrane layer on the top surface to seal the cavity; and forming a structure on the upper side of the membrane layer. After forming a cantilever structure on the membrane layer and etching the membrane layer, a cantilever structure is produced in a floating state over the cavity. Also, at least one inlet hole and outlet hole can be formed in the porous layer and the membrane, thereby providing a sealed fluidic channel.

12 Claims, 13 Drawing Sheets

MANUFACTURING METHOD OF A MEMS STRUCTURE, A CANTILEVER-TYPE MEMS STRUCTURE, AND A SEALED FLUIDIC CHANNEL

CROSS-REFERENCE TO RELATED APPLICATIONS

This application claims benefit under 35 U.S.C. § 119 from Korean Patent Application No. 2005-06283, filed on Jan. 24, 2005, the entire content of which is incorporated herein by reference.

BACKGROUND OF THE INVENTION

1. Field of the Invention

The present invention relates to a method of manufacturing a micro electro mechanical system structure, a cantilever-type micro electro mechanical system structure, and a sealed fluidic channel. More particularly, the present invention relates to a method of manufacturing a micro electro mechanical system structure, a cantilever-type micro electro mechanical system structure, and a sealed fluidic channel that eliminates the necessity of using a sacrificial layer provided at a predetermined interval from a substrate.

2. Description of the Related Art

According to a surface micro-machining technology which is based on a semiconductor integrated circuit manufacturing process for machining a thin film element, it is possible to manufacture a minute structure on a silicon substrate and to couple it with semiconductor circuitry, so that a micro electro mechanical system (hereinafter, referred to as "MEMS") element such as a micro-sensor can be manufactured. Here, in the remaining portion of the minute structure, excepting one side or both sides thereof, it is necessary to form a space so as to float the minute structure over the substrate. Therefore, in order to form the minute structure, a method of using a sacrificial layer has been adopted, and materials which have a good etching selectivity to the structure material have been used as the sacrificial layer.

U.S. Pat. No. 6,762,471 discloses an example of forming a minute structure by using a sacrificial layer as discussed above.

FIG. 1 shows a known minute thin film resonator, which illustrates the construction of the thin film resonator disclosed in U.S. Pat. No. 6,762,471.

In its construction, the thin film resonator 100 is provided with a supporting member (e.g. supporting layer) 155, posts 140 and 141, a first electrode 165, an insulating film 175, and a second electrode 185. The thin film resonator 100 is formed with a predetermined gap (e.g., air gap) on the substrate 110. On the substrate 110, a circuit 105 is present, to which the second electrode 175 and the circuit 105 are connected through a connecting member 220.

FIGS. 2A to 2G illustrate the process used to form the thin film resonator shown in FIG. 1 with a predetermined gap on the substrate, in which a first electrode 165, an insulating film 175, and a second electrode 185 forming a floating structure with a predetermined gap D will be discussed.

Referring to FIG. 2A, the sacrificial layer 120 is deposited on the substrate 110, and then holes 130 and 131 are formed. Next, referring to FIG. 2B, a BPSG (borophosphosilicate glass) layer 135 is deposited. Here, the BPSG layer 135 is embedded through holes 130 and 131 to form posts 140 and 141, which support the thin film resonator 100 that will be formed in the subsequent step. As shown in FIG. 2C, BPSG layer 135, which is deposited on the sacrificial layer 120, is polished. Subsequently, referring to FIG. 2D, in the upper side of the sacrificial layer 120 in which posts 140 and 141 are embedded via holes 130 and 131, a silicon nitride layer 150 is deposited, which becomes a support layer 155. Next, a first metal layer 160 which forms the first electrode 165 is deposited, and a second metal layer 180 which forms the second electrode 185 is deposited. Referring to FIG. 2E, the second metal layer 180, the insulating layer 170, and the first metal layer 160 are patterned sequentially in a shape of the thin film resonator 100. Referring to FIG. 2F, a silicon nitride film 150 is patterned in a shape of the support layer 155, in which openings 195 and 196 are formed. Referring to FIG. 2G, an etching solution containing a hydrofluoric (hereinafter, referred to as "HF") acid solution moves through the openings 195 and 196 to remove the sacrificial layer 120. Thereafter, washing and drying steps are carried out to form the thin film resonator 100.

The sacrificial layer is generally removed by a wet etching process, i.e., the process of etching after immersing the wafer into a chemical solution containing a HF solution, and then washing and drying.

However, in the above-mentioned conventional method, an undesirable stiction phenomenon occurs, in which the minute structure (e.g., thin film resonator 100) moves down in a space C from which the sacrificial layer is removed due to a capillary force as a result of surface tension during the drying step after washing.

Such stiction phenomenon deteriorates the performance of the minute structure, which leads to a decrease in yield due to failure of the element during manufacturing.

SUMMARY OF THE INVENTION

In order to overcome the problems described above, a primary object of the present invention is to provide a method of manufacturing the minute structure without using a sacrificial layer.

Another object of the present invention is to provide a method of manufacturing a cantilever-type MEMS structure based on the manufacturing process of a minute structure.

Still another object of the present invention is to provide a method of manufacturing a sealed fluidic channel based on the above-mentioned manufacturing process of a minute structure.

In order to accomplish the objects described above, according to a first aspect of the present invention, a method of manufacturing a MEMS structure is provided which comprises: forming a trench in a P-type silicon substrate; forming an oxide film (e.g., SiO$_2$) on a P-type silicon substrate to form a barrier by embedding the trench with the oxide film; removing the oxide film formed on the substrate, except for the barrier embedded in the trench; forming a mask layer on the substrate where the oxide film has been removed and removing a portion corresponding to an inside of the barrier; forming a porous layer having a predetermined thickness on the upper side of the substrate corresponding to the inside of the barrier; removing the substrate corresponding to the lower area of the porous layer to form a cavity; removing the mask layer formed outside the barrier, sealing the upper side of the cavity with a membrane layer; and then forming a structure on the upper side of the membrane layer.

In a preferred embodiment, the trench is formed by deep reactive ion etching (deep RIE).

In another preferred embodiment, the oxide film is formed by thermal oxidation of the silicon substrate or by thin film deposition on the silicon substrate.

The step of removing the oxide film formed on the substrate except for the barrier embedded in the trench is preferably carried out by chemical mechanical polishing.

In another preferred embodiment, the mask layer is preferably formed of a silicon nitride film, the deposition of the mask layer is performed by chemical vapor deposition, and the etching of the mask layer is performed by reactive ion etching.

In the step of forming the porous layer, preferably the P-type silicon substrate is immersed into a chemical solution to treat it electrochemically, in which an electric current lower than a critical current value is applied.

In the step of forming the cavity, preferably the P-type silicon substrate is immersed into a chemical solution to treat it electrochemically, in which an electric current larger than a critical current value is applied.

In the step of forming the membrane layer, the membrane layer is preferably formed of an insulating material, and the insulating material includes an oxide film such as $SiO_2$, a silicon nitride film such as $Si_3N_4$, and a polysilicon film.

Here, the oxide film can be formed by thermal oxidation or thin film deposition such as chemical vapor deposition; and the silicon nitride film can be formed by thin film deposition such as chemical vapor deposition.

The polysilicon film can be deposited by physical vapor deposition, and the like.

According to a second aspect, the present invention provides a method of manufacturing a MEMS structure which comprises depositing a mask layer for cavity formation on an N-type silicon substrate and removing an area where a cavity is to be formed; doping a P-type material on the substrate where the mask layer has been removed to form a P-type silicon layer; forming a porous layer having a predetermined thickness on the upper side of the P-type silicon layer; removing the P-type silicon layer corresponding to the lower area of the porous layer to form a cavity; removing the mask layer formed on the substrate; sealing the upper part of the cavity with a membrane layer; and forming a structure on the upper side of the membrane layer.

In a preferred embodiment, the mask layer is preferably formed of silicon nitride, and the etching of the mask layer is formed by reactive ion etching.

In the step of forming the porous layer, preferably the silicon substrate is immersed into a chemical solution to treat it electrochemically, in which an electric current smaller than a critical current value is applied.

In the step of forming the cavity, preferably the silicon substrate is immersed into a chemical solution to treat it electrochemically, in which an electric current larger than a critical current value is applied.

In the step of forming the membrane layer, the membrane layer is preferably formed of an insulating material, and the insulating material may include an oxide film such as $SiO_2$, a silicon nitride film such as $Si_3N_4$, and a polysilicon film.

Here, the oxide film can be formed by thermal oxidation or thin film deposition such as chemical vapor deposition.

The silicon nitride is preferably formed by thin film deposition such as chemical vapor deposition.

The polysilicon film can be formed by, for example, chemical vapor deposition or physical vapor deposition, and the like.

The doping of a P-type material can be performed by ion implantation or thermal diffusion.

According to a third aspect, the present invention provides a method of manufacturing a cantilever-type MEMS structure which comprises forming a trench in a P-type silicon substrate; forming an oxide film (e.g., $SiO_2$) on the P-type silicon substrate to form a barrier by embedding the trench with the oxide film; removing the oxide film formed on the substrate except for the barrier embedded in the trench; forming a mask layer on the substrate where the oxide film has been removed and removing a portion corresponding to an inside of the barrier; forming a porous layer having a predetermined thickness on the upper part of the substrate corresponding to the inside of the barrier; etching the substrate corresponding to the lower area of the porous layer to form a cavity; removing the mask layer formed outside the barrier; forming a membrane layer on the substrate and the porous layer; forming a cantilever-type structure on the upper side of the membrane layer and patterning it in a shape of the cantilever-type structure; and etching the membrane layer including the porous layer so as to float one end of the cantilever-type structure over the cavity.

According to a fourth aspect, the present invention provides a method of manufacturing a cantilever-type MEMS structure which comprises forming a trench in a P-type silicon substrate; forming an oxide film (e.g., $SiO_2$) on the P-type silicon substrate to form a barrier by embedding the trench with the oxide film; removing the oxide film formed on the substrate except for the barrier embedded in the trench; forming a mask layer on the substrate where the oxide film has been removed and removing a portion corresponding to an inside of the barrier; forming a porous layer having a predetermined thickness on the upper part of the substrate corresponding to the inside of the barrier; etching the substrate corresponding to the lower area of the porous layer to form a cavity; removing the mask layer formed outside the barrier; forming a cantilever-type structure on the substrate and the porous layer, and patterning it in a shape of the cantilever-type structure; and etching the porous layer so as to float one end of the cantilever-type structure over the cavity.

According to a fifth aspect, the present invention provides a method of manufacturing a cantilever-type MEMS structure which comprises depositing a mask layer for cavity formation on a N-type substrate and removing an area where the cavity is to be formed; doping a P-type material into the substrate where the mask layer has been removed, to form a P-type silicon layer; forming a porous layer in a predetermined thickness on the upper part of the P-type silicon layer; removing the P-type silicon layer corresponding to the lower area of the porous layer to form a cavity; removing the mask layer formed on the substrate; forming a membrane layer on the substrate and the porous layer; forming a cantilever-type structure on the upper side of membrane layer and patterning it in a shape of the cantilever-type structure; and etching the membrane layer including the porous layer to float one end of the cantilever-type structure on the cavity.

According to a sixth aspect, the present invention provides a method of manufacturing a cantilever-type MEMS structure which comprises depositing a mask layer for cavity formation on an N-type silicon substrate and removing an area where the cavity is to be formed; doping a P-type material into the substrate in those areas where the mask layer has been removed to form a P-type silicon layer; forming a porous layer having a predetermined thickness on the upper part of the P-type silicon layer; removing the P-type silicon layer corresponding to the lower area of the porous layer to form a cavity; removing the mask layer formed on the substrate; forming a cantilever-type structure on the substrate and the porous layer, and patterning it in a shape of the cantilever-type structure; and etching the porous layer so as to float one end of the cantilever-type structure on the cavity.

According to a seventh aspect, the present invention provides a method of manufacturing a sealed fluidic channel which comprises forming a trench in a P-type silicon substrate; forming an oxide film (e.g., $SiO_2$) on the P-type silicon substrate to form a barrier by embedding the trench with the oxide film; removing the oxide film formed on the substrate except for the barrier embedded in the trench; forming a mask layer on the portion of the substrate where the oxide film has been removed and removing a portion corresponding to the inside of the barrier; forming a porous layer having a predetermined thickness on the upper part of the substrate corresponding to the inside of the barrier; etching the substrate corresponding to the lower area of the porous layer to form a cavity; removing the mask layer formed outside the barrier; forming a membrane layer on the substrate and the porous layer; and forming at least one inlet hole for inflow of the fluid and at least one outlet hole for discharge of the fluid in the porous layer and the membrane layer.

According to an eighth aspect, the present invention provides a method of manufacturing a sealed fluidic channel which comprises depositing a mask layer for cavity formation on an N-type silicon substrate and removing an area where the cavity is to be formed; doping a P-type material into the substrate in those areas where the mask layer has been removed to form a P-type silicon layer; forming a porous layer having a predetermined thickness on the upper part of the P-type silicon layer; removing the P-type silicon layer corresponding to the lower area of the porous layer to form a cavity; removing the mask layer formed on the substrate; forming a membrane layer on the substrate and the porous layer; and forming at least one inlet hole for inflow of the fluid and at least one outlet hole for discharge of the fluid in the porous layer and the membrane layer.

According to the method of manufacturing the MEMS structure, in fabricating a cantilever-type MEMS structure and a fluidic channel, by previously forming the cavity before manufacturing the structure and forming the membrane layer for sealing the cavity, an unnecessary process for forming and removing the sacrificial layer can be eliminated.

Also, according to the present invention, since the structure protection apparatus is not necessary, it is possible to prevent breakdown of the structure.

Further, according to the present invention, a MEMS element based on a new concept can be designed.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE PREFERRED EMBODIMENTS

Figure 1:
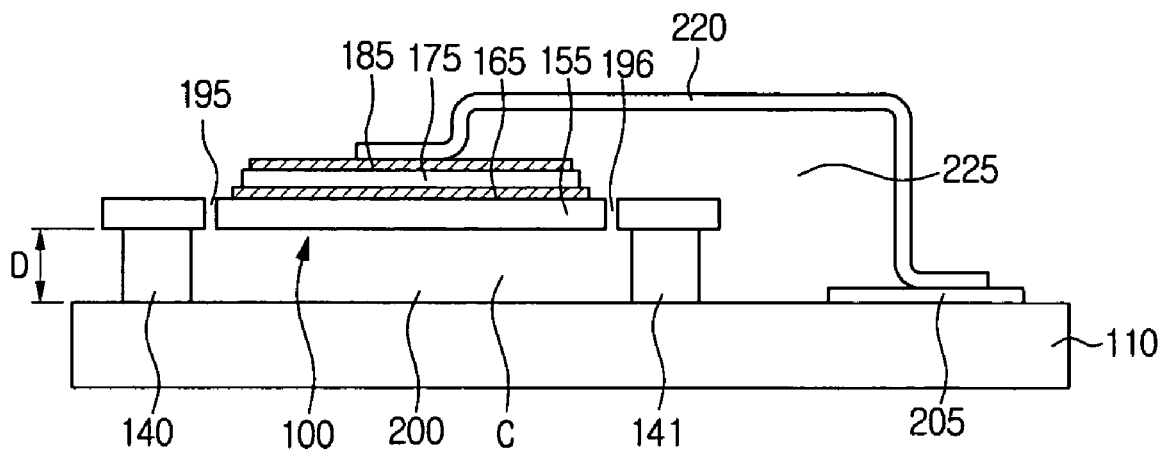
FIG. 1 shows a thin film resonator disclosed in U.S. Pat. No. 6,762,471, as a minute resonator in the prior art.
Figure 2A:
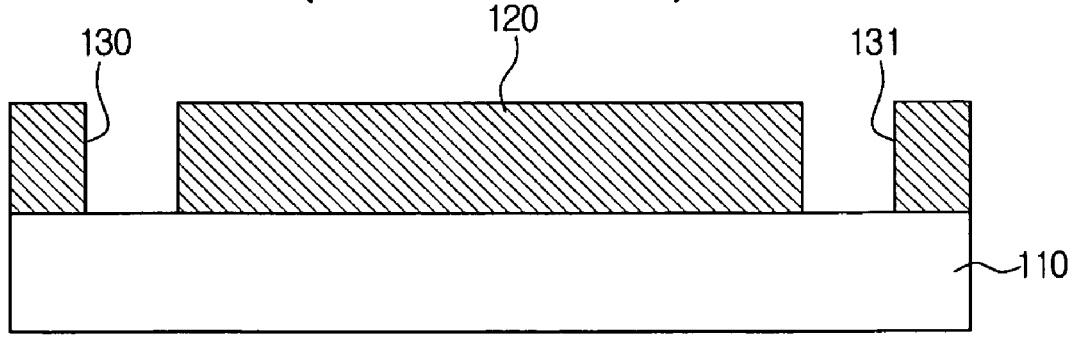
FIGS. 2A to 2G show the process used to form the thin film resonator shown in FIG. 1 with a predetermined gap on the substrate, more particularly, a process in which a first electrode, an insulating film, and a second electrode form a floating structure with a predetermined gap, together.
Figure 2B:
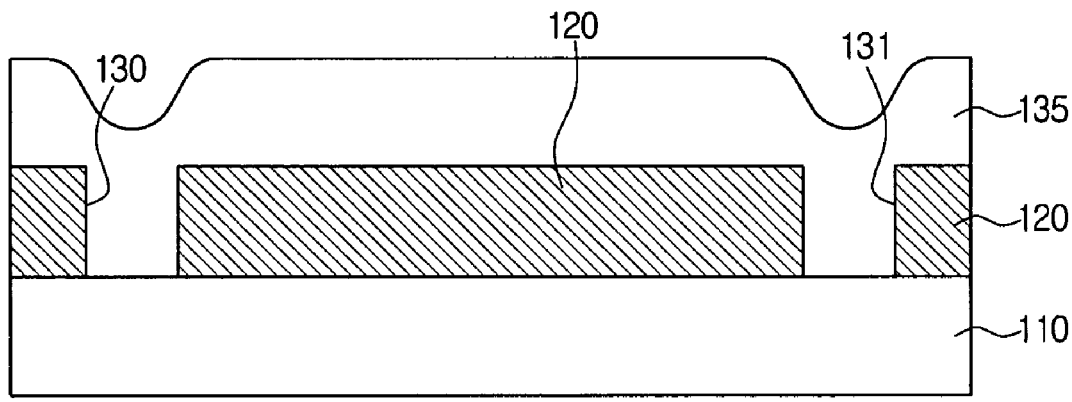
Figure 2C:
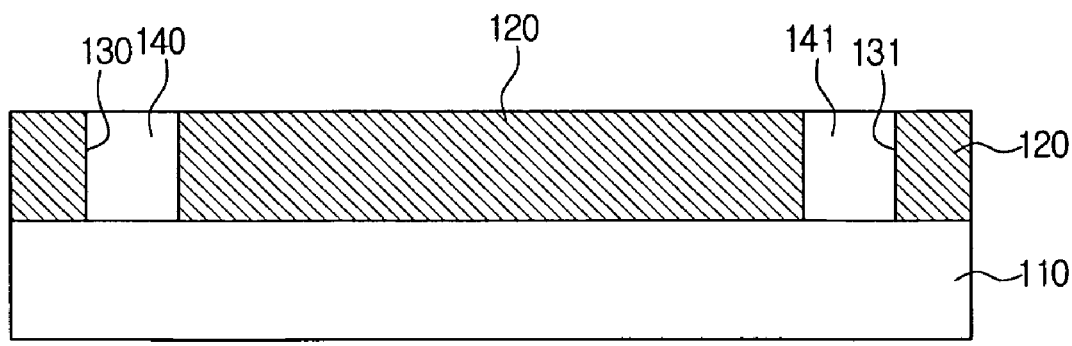
Figure 2D:
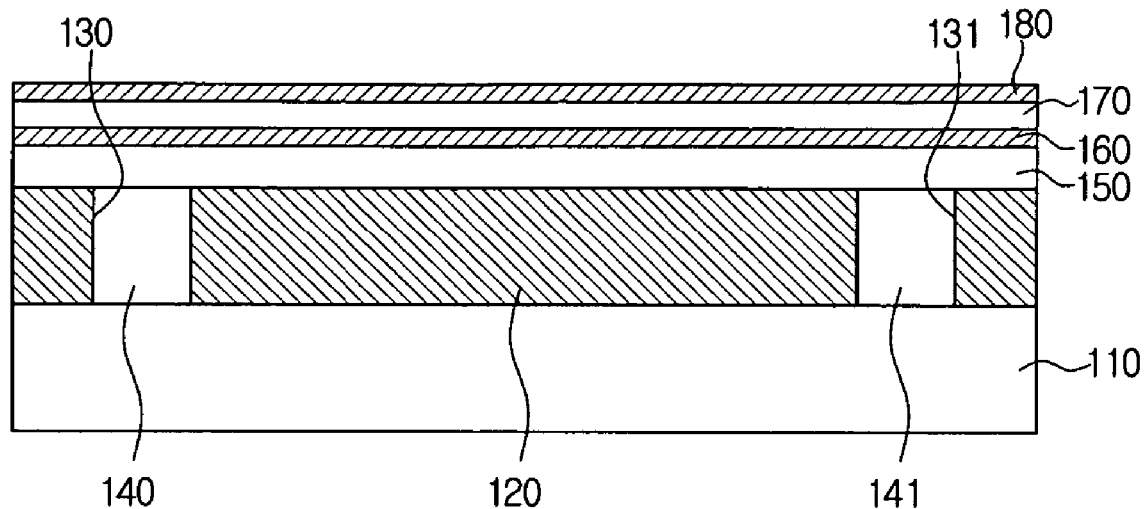
Figure 2E:
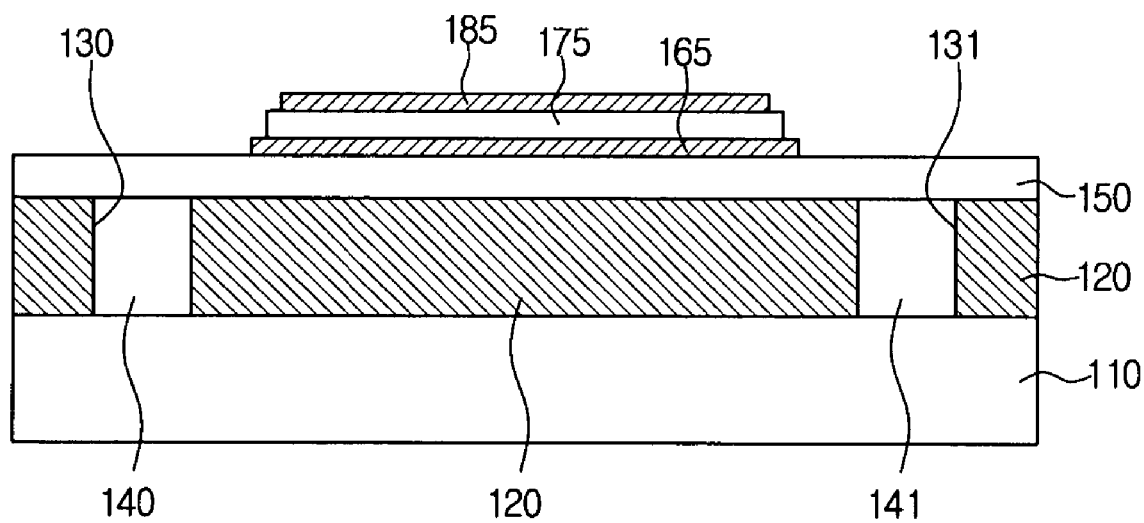
Figure 2F:
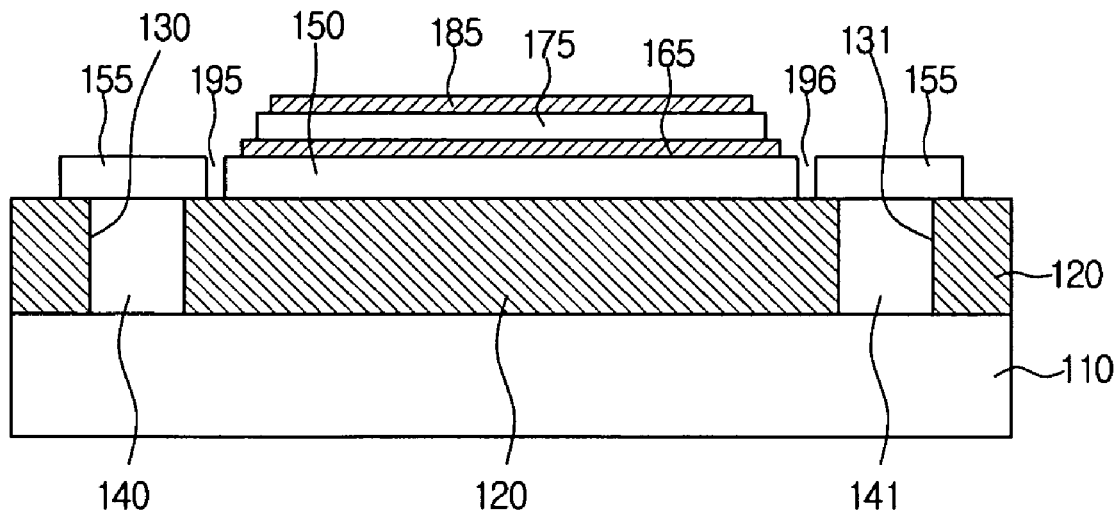
Figure 2G:
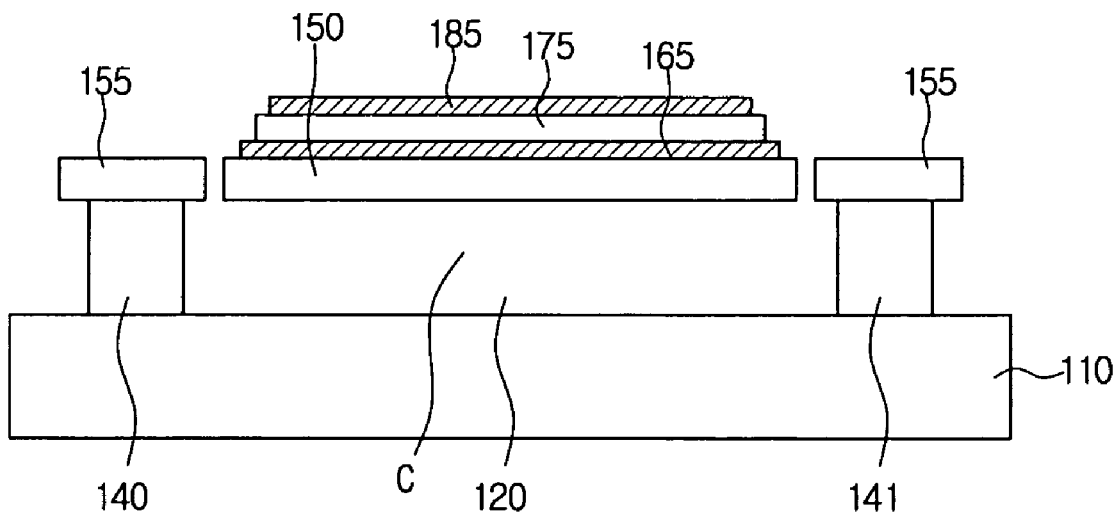

Certain embodiments of the present invention will be described in greater detail with reference to the accompanying drawings. However, the present invention should not be construed as being limited thereto.

In the following description, the same reference numerals are used for the same elements in different drawings. The following detailed description of construction and elements is provided to assist in a comprehensive understanding of the invention. Thus, it is apparent that the present invention can be carried out in various embodiments without being limited thereto. Also, well-known functions of constructions are not described in detail since they would obscure the invention in unnecessary detail.

Example 1

FIGS. 3A to 3G show a process used for forming the resonator, more particularly, the process in which a minute structure is formed so as to float from the substrate according to one embodiment of the present invention.

Figure 3A:
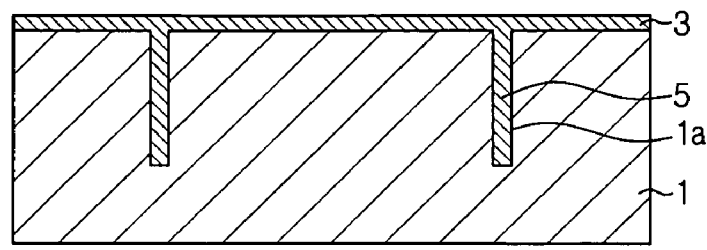
FIGS. 3A to 3G show a process for forming a resonator, more particularly, a process in which a minute structure is formed so as to float from the substrate according to one embodiment of the present invention.

Referring to FIG. 3A, a trench 1a is formed in a P-type silicon substrate 1 and an oxide film 3 such as $SiO_2$ is formed therein. The trench 1a is etched by a deep reactive ion etching technique. Deep RIE is used to etch deep cavities in substrates with a relatively high aspect ratio. Often, a fluoropolymer is used to passivate the etching of the sidewalls. Also, the oxide film 3 can be formed by thin film deposition or thermal oxidation to the P-type silicon substrate 1. As the thin film deposition, chemical vapor deposition (hereinafter, referred to as "CVD") or physical vapor deposition (hereinafter, referred to as "PVD"), and the like can be performed. Then, the oxide film 3 is embedded into the trench 1a, in which a barrier 5 for forming a cavity 4 (not shown), which will be discussed later, can be formed. According to another embodiment, $Ta_2O_5$ and $Al_2O_3$ may be used as the oxide film instead of $SiO_2$. Another insulating material such as SiN may also be used instead of the oxide film.

Figure 3B:
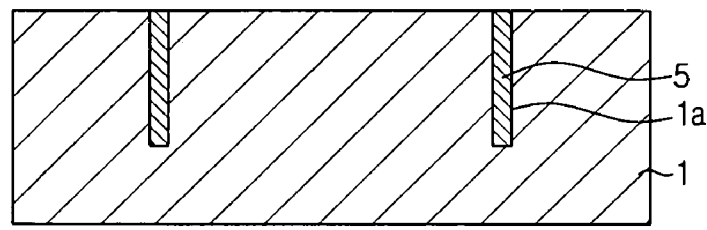

Referring to FIG. 3B, the oxide film 3 formed on the P-type silicon substrate 1 is removed, leaving only the barrier 5 embedded in the trench 1a. The oxide film 3 can be removed by, for example, chemical mechanical polishing using a planarization method.

Figure 3C:
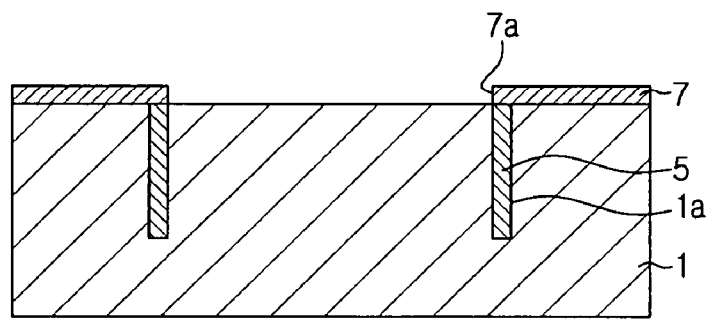

Referring to FIG. 3C, a silicon nitride layer 7 is deposited on the upper side of the P-type silicon substrate from which the oxide film 3 has been removed. A mask to form the cavity 4 (as shown in FIG. 3E), in the central portion of silicon nitride layer 7, opening 7a is etched to expose an internal area defined by the barriers 5. Then, the silicon nitride layer 7 is formed by, for example, CVD, particularly low pressure chemical vapor deposition, and etched by reactive ion etching.

Figure 3D:
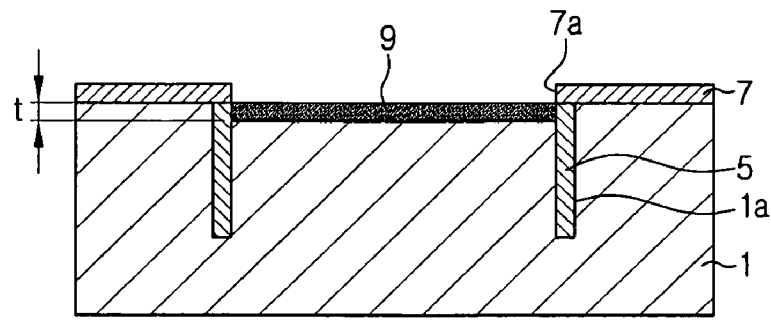
Figure 3E:
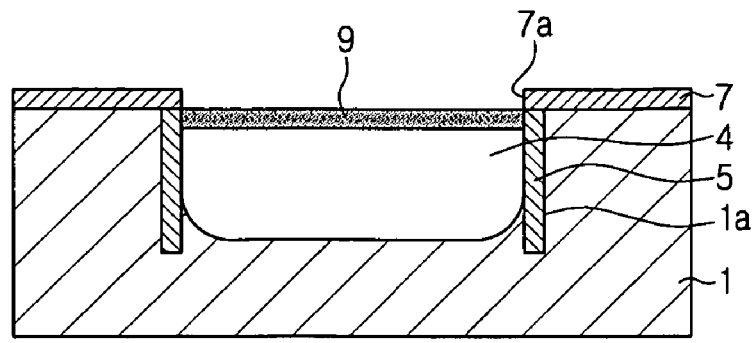

Referring to FIG. 3D, the upper side of the P-type silicon substrate 1 exposed via the opening 7a of silicon nitride layer 7 is electrochemically treated to form a silicon porous layer 9 having a predetermined thickness t. Then, the silicon porous layer 9 is subjected to a moderate electrochemical treatment after immersing the P-type silicon substrate 1 into a chemical solution, for example, HF solution, at an applied current which is lower than a critical current value. Also, the thickness can be controlled by adjusting the time of the applied current. Porous Si manufacturing technology is also described in U.S. Pat. Nos. 6,355,498 and 6,060,818, incorporated herein by reference.

A hole is an important factor in manufacturing the porous Si ($2hole^+ + 6HF + Si \rightarrow SiF_6^{2-} + H_2 + 4H^+$). More specifically, a hole is supplied by applying +bias to a Si substrate and a polishing mode changes according to a current density J. If a small amount of hole is supplied (low J), there is a limitation to amount of hole required for a polishing and thus the polishing proceeds to form pores (porous Si), and, if a large amount of hole is supplied (high J), a polishing actively proceeds so that an electrochemical polishing occurs. If the current density reaches a certain value, a polishing rate abruptly increases. The certain value is referred to as a critical current density. The polishing mode changes from the critical current density. The critical current density is different depending on a doping material and density. The above-described porous Si manufacturing technology is a well-known technology and is disclosed in U.S. Pat. Nos. 6,355, 498 and 6,060,818.

Referring to FIG. 3E, a portion corresponding to the lower area of silicon porous layer 9 is removed to form the cavity 4. Then, the cavity can be treated electrochemically after immersing into the chemical solution, for example, a HF solution, similar to the step of forming the silicon porous layer 9. The applied current is larger than a critical current value. Accordingly, the silicon porous layer 9 formed at the upper side of the substrate remains without etching.

Figure 3F:
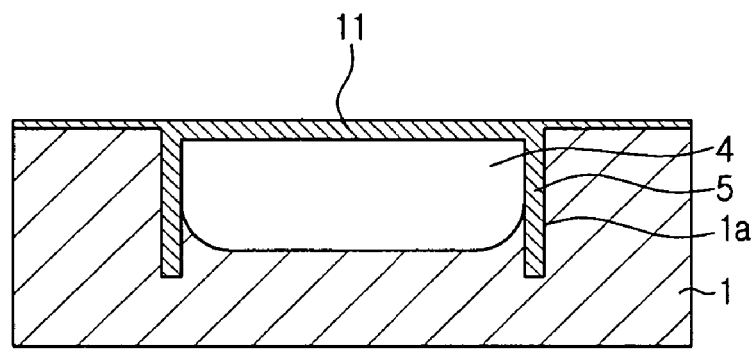

Referring to FIG. 3F, a membrane layer 11 for sealing the cavity 4 is formed, in which the membrane layer 11 is preferably formed of an insulating material, such as an oxide film (e.g., $SiO_2$), silicon nitride film (e.g., $Si_3N_4$), and polysilicon film. Then, the oxide film is formed by thermal oxidation. In the oxidation process, since the oxide film is formed while consuming the porous silicon, the silicon porous layer 9 is changed into an oxide film. Also, the oxide film and nitride film are formed by thin film deposition. The thin film deposition can be performed by, for example, CVD, while the polysilicon can be formed by CVD or PVD. FIG. 3F shows an example for forming membrane layer by a thermal oxidation process. If a deposition method is used, a thin film such as silicon nitride film or polysilicon film is mainly deposited on the silicon porous layer to form a membrane layer (not shown) which is comprised of the dual film of thin film/polysilicon porous layer 9.

Figure 3G:
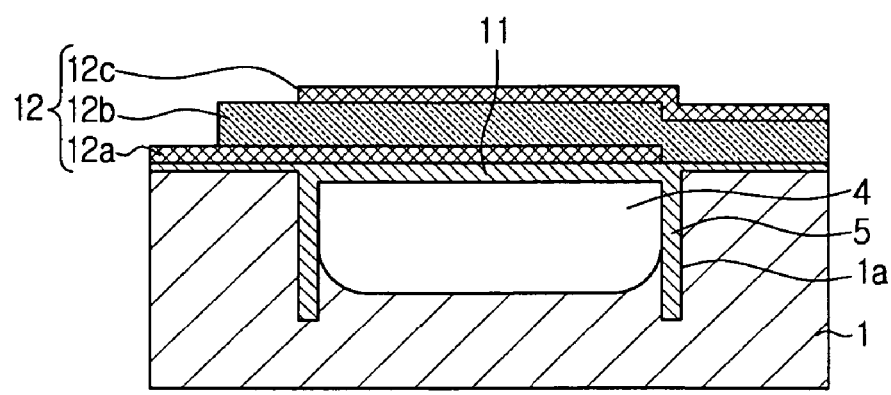

Referring to FIG. 3G, a structure 12 is formed on the membrane layer 11. Then, the resulting structure 12 forms a resonator and includes a first electrode layer 12a, a piezoelectric layer 12b, and a second electrode layer 12c.

Example 2

FIGS. 4A to 4E show the process for forming the resonator, more particularly, the process in which a MEMS structure is formed so as to float from the substrate according to another embodiment of the present invention.

Figure 4A:
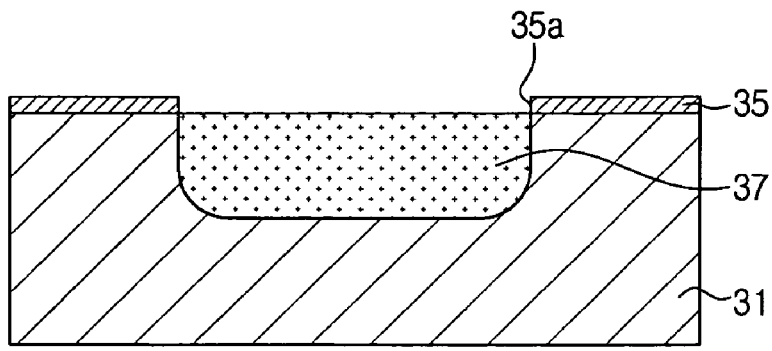
FIGS. 4A to 4E show a process for forming the resonator, more particularly, a process in which a MEMS structure is formed so as to float from the substrate according to another embodiment of the present invention.

Referring to FIG. 4A, an N-type silicon substrate 31 is provided, and a mask layer 35 to form the cavity, which will be described later, is deposited thereon. Then, the mask layer 35 is formed with an opening 35a to expose the central portion of the N-type silicon substrate 31. The mask layer 35 is formed of an insulating material, for example, silicon nitride (e.g., $Si_3N_4$), and is deposited by CVD. Also, etching can be performed by reactive ion etching (RIE).

Next, a P-type material is diffused into the central portion of the N-type silicon substrate 31 exposed via the opening 35 to form a P-type silicon layer 37.

Figure 4B:
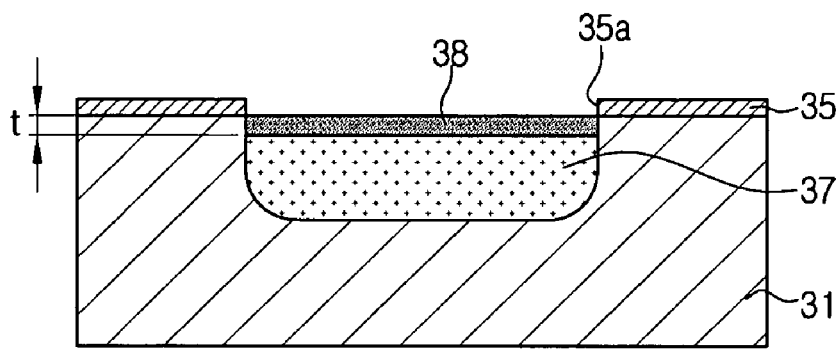

Referring to FIG. 4B, a porous layer 38 is formed on the upper side of the P-type silicon layer 37 having a predetermined thickness. Here, since the porous layer 38 (the embodiment 1) is formed in the same manner as described in FIG. 3D, its detailed explanation will be omitted.

Figure 4C:
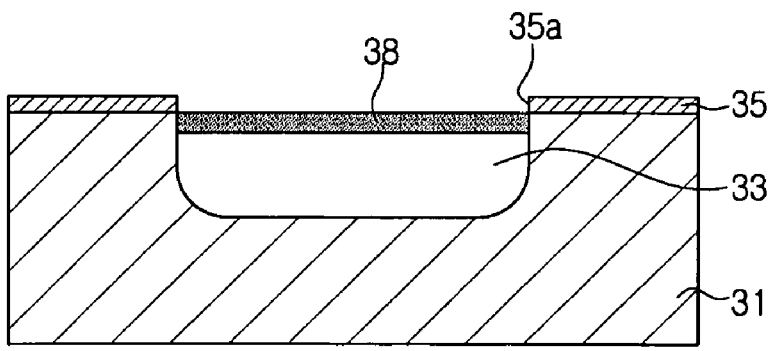

Referring to FIG. 4C, the lower area of the P-type silicon layer 37, wherein the porous layer 38 is formed, is electrochemically polished to form a cavity 33. Since the cavity 33 is formed in the same manner as shown in FIG. 3E, its detailed explanation will be omitted.

Figure 4D:
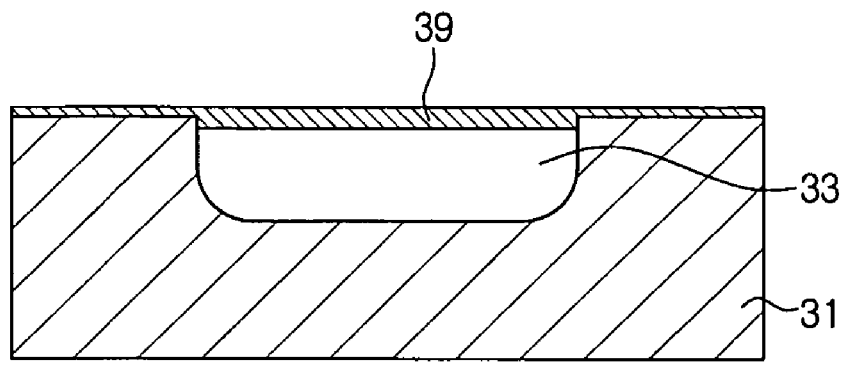

Referring to FIG. 4D, after removing the mask layer 35, the membrane layer 39 is formed, and the cavity 33 can be sealed in this step. The membrane layer 39 is preferably formed of an insulating material such as an oxide film, silicon nitride film, polysilicon film, and the like, in the same manner as in embodiment 1. Here, since the step for forming the oxide film is the same as that shown in FIG. 3, its detailed explanation will be omitted. Note that FIG. 4C and FIG. 4D show that the porous layer 38 is oxidized and then changed to the membrane layer 39, such as an oxide film.

Figure 4E:
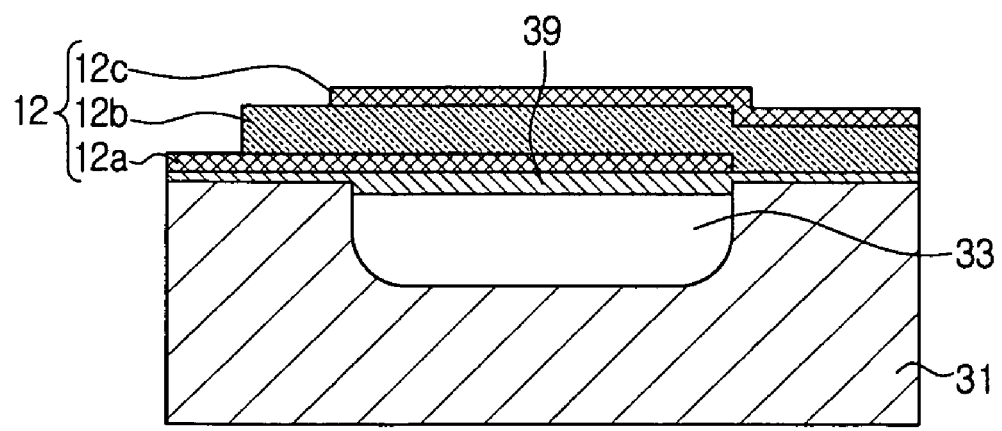

Referring to FIG. 4E, the structure 12 is formed at the upper side of the membrane layer 39.

The above described embodiment 2 has an advantage in being capable of eliminating the process which forms the barrier 5 for limiting an area in which silicon porous layer 9 and cavity 4 are to be formed in the embodiment 1 (e.g., the step of forming a trench 1a, and the step of etching and removing the oxide film 3), thereby reducing the number of steps in the total process.

In the above explanations, the structure 12 has been described as the resonator, however, the structure 12 is not limited thereto. For instance, the structure 12 may be a pressure sensor or an actuator, as well as, a cantilever-type structure where only one end thereof is supported, or a fluidic channel, and the like.

Figure 5A:
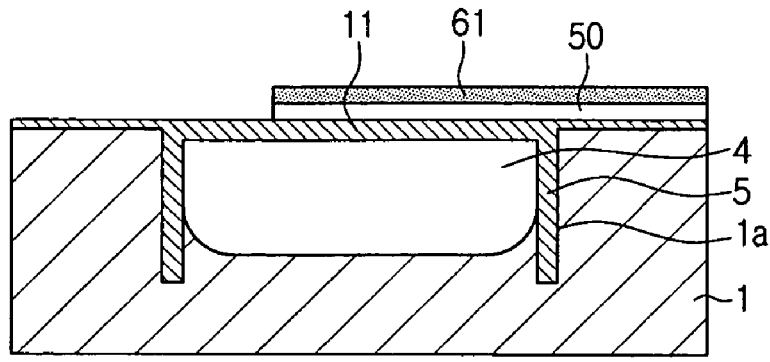
FIGS. 5A to 5C show a process in which a cantilever-type structure is formed on the membrane based on the process shown in FIGS. 3A to 3F.
Figure 5B:
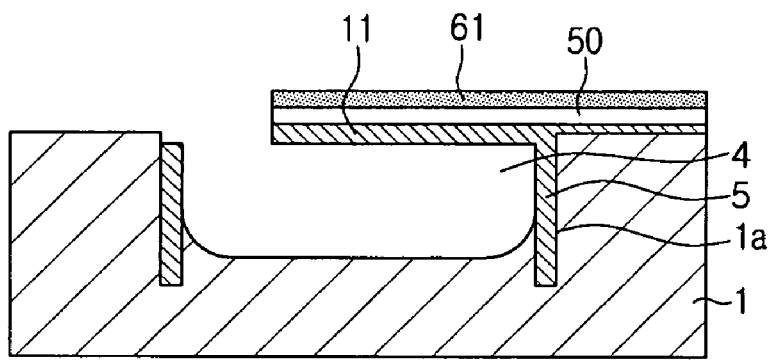
Figure 5C:
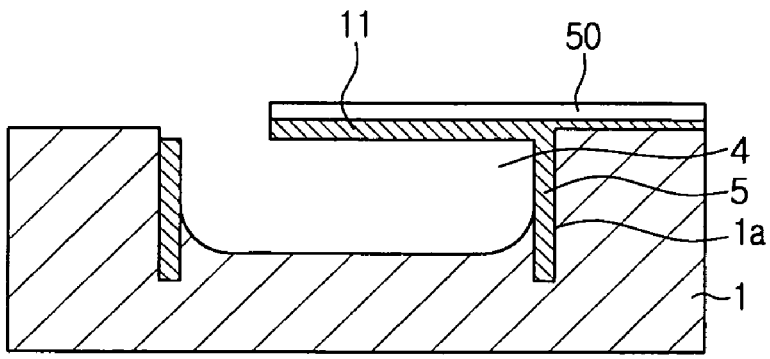

FIGS. 5A to 5C show a process where a cantilever-type structure is formed on the membrane based on the embodiment 1. In FIGS. 5A to 5C, as the same members as in the embodiment 1 have identical reference numerals, description thereof will thus be omitted.

In this case, the steps of forming the cavity 4 on the substrate 1 and sealing the membrane layer 11 are identical with those shown in FIGS. 3A to 3F.

Thereafter, as shown in FIG. 5A, the cantilever structure layer is formed on the upper side of the membrane 11, and then patterned in a cantilever-type structure 50 shape. In the drawing, reference numeral 61 designates the mask layer for forming the cantilever-type structure 50, and it is formed of, for example, photoresist.

Then, as shown in FIG. 5B, the membrane layer 11 is removed to float one end of the cantilever-type structure over the cavity 4. That is, a projection portion of one end of the cantilever structure projects as an overhang over the cavity. Here, if the membrane layer 11 is made of an oxide film, it is possible to remove the oxide film by vapor phase HF etching, which is a type of dry etching.

Subsequently, as shown in FIG. 5C, the photoresist layer 61 serving as the mask layer is removed, thereby fully forming the cantilever-type structure 50.

Figure 6A:
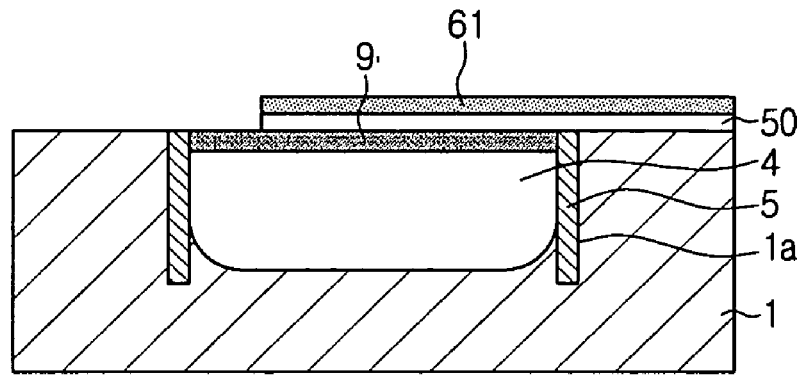
FIGS. 6A to 6C show a process in which a cantilever-type structure is formed on the porous layer based on the process shown in FIGS. 3A to 3D.
Figure 6B:
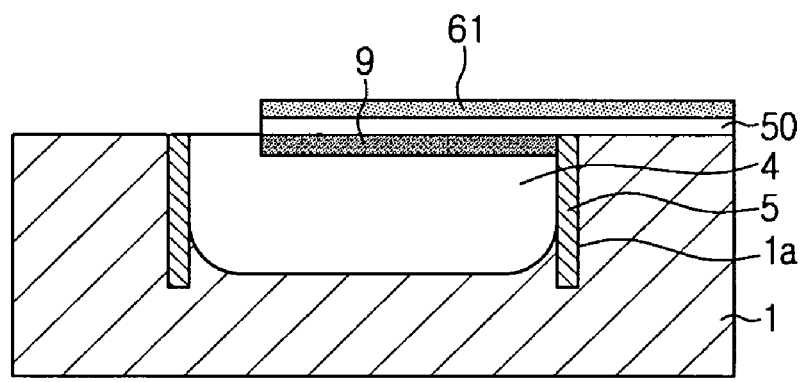
Figure 6C:
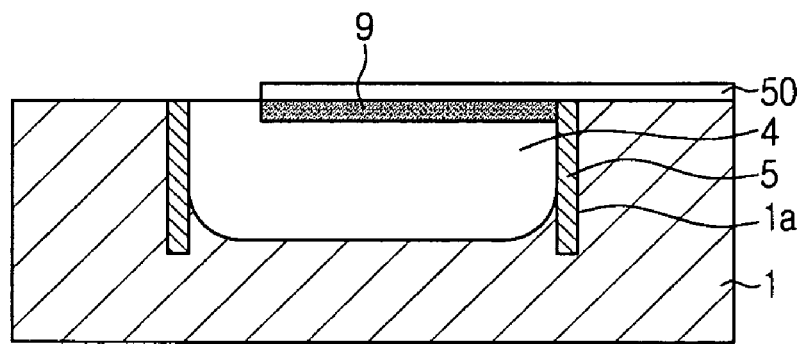

FIGS. 6A to 6C show a process where the cantilever-type structure is formed on the porous layer based on the embodiment 1.

In FIGS. 6A to 6C, the cantilever-type structure is directly formed on the porous layer, in which the process for forming the cantilever-type structure is similar to the process shown FIGS. 5A to 5C, except for the step for forming the membrane layer 11. The difference between FIGS. 6A to 6C and FIGS. 5A to 5C is that the steps in FIGS. 6A to 6C are performed by an isotropic etching method to remove the porous layer 9.

Figure 7A:
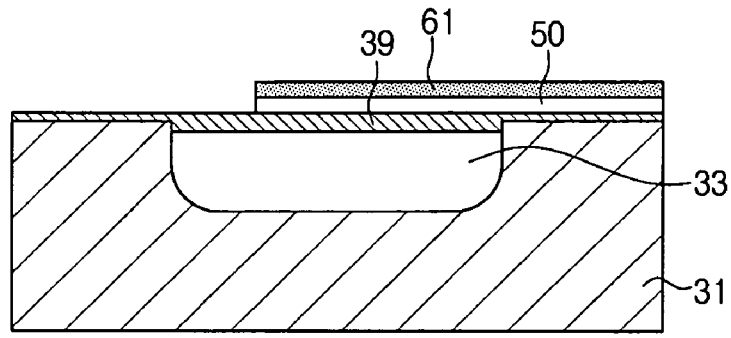
FIGS. 7A to 7C show a process in which a cantilever-type structure is formed on the membrane based on the process shown in FIGS. 4A to 4D.
Figure 7B:
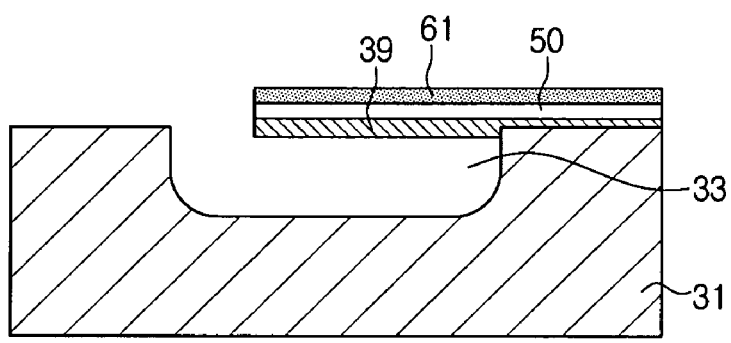
Figure 7C:
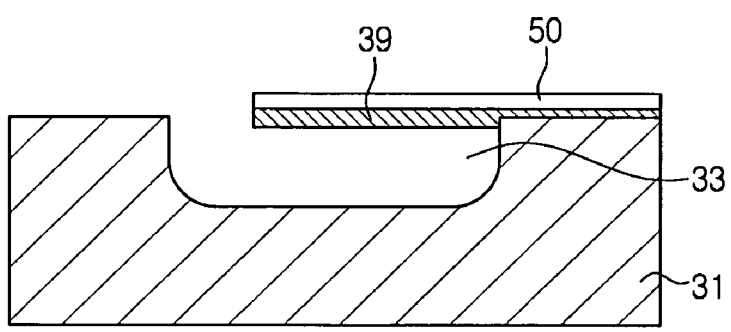

FIGS. 7A to 7C show a process where the cantilever-type structure 50 is formed based on the process of embodiment 2, in which the cantilever-type structure 50 is formed on the membrane 39. Here, the cantilever-type structure 50 is formed based on the embodiment 2. Since the same members as in the embodiment 2 have identical reference numerals, description thereof will thus be omitted.

In this case, the steps for forming the membrane layer 39 are performed in accordance with FIGS. 4A to 4D. Thereafter, since the process for forming the cantilever-type structure shown in FIGS. 7A to 7C is identical to the process shown in FIGS. 5A to 5C, descriptions thereof will be omitted.

Figure 8A:
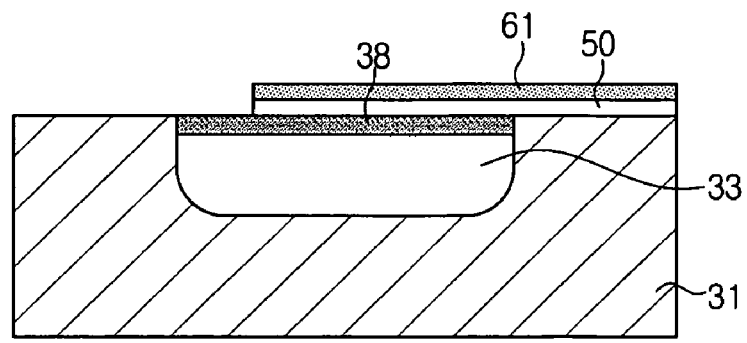
FIGS. 8A to 8C show a process in which a cantilever-type structure is formed on the porous layer based on the process shown in FIGS. 4A to 4D.
Figure 8B:
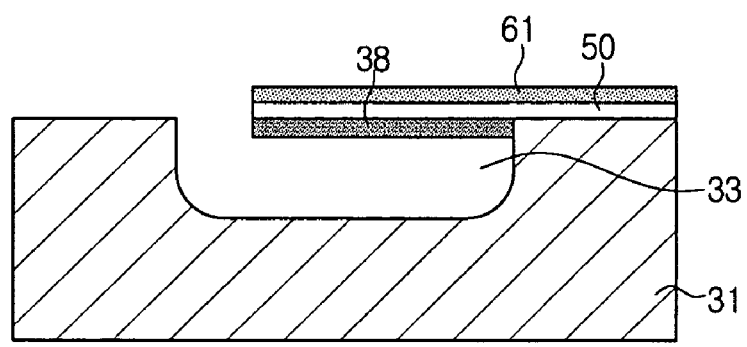
Figure 8C:
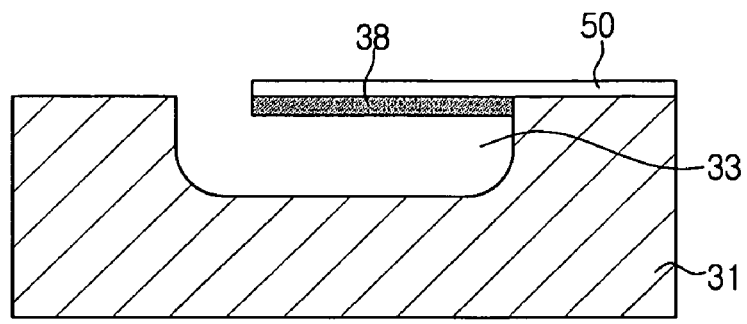

Then, FIGS. 8A to 8C show a process where the cantilever-type structure 50 is formed based on the process shown in the embodiment 2, in which the cantilever-type structure 50 is formed on the porous layer 38.

In this case, the steps for forming the porous layer 38 on the substrate 31 and forming the cavity 33 are identical with those steps in FIGS. 4A to 4C. Thereafter, after removing the mask layer 35 formed on the substrate 31, the cantilever-type structure 50 is formed on the porous layer 38. The cantilever-type structure 50 is formed in accordance with the steps shown in FIGS. 6A to 6C.

The cantilever-type structure 50 formed as described above can be applied to any storage apparatus such as a STM probe, an AFM probe, and the like.

Figure 9A:
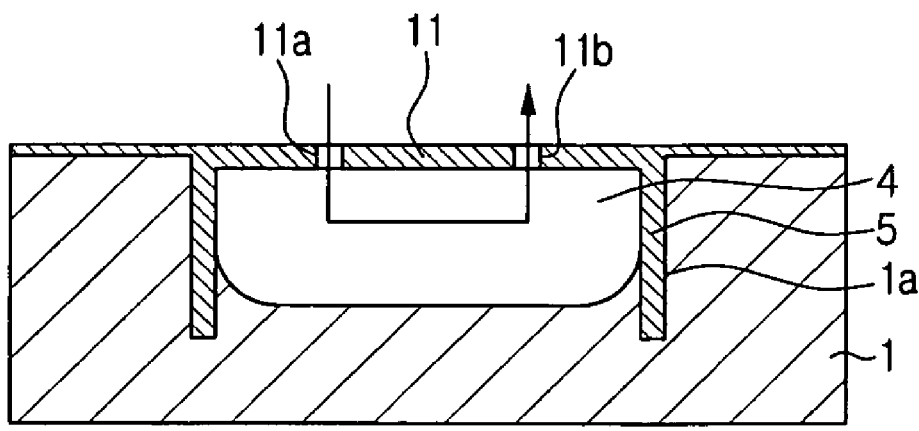
FIG. 9A shows an example in which a sealed fluidic channel is formed based on FIGS. 3A to 3F.
Figure 9B:
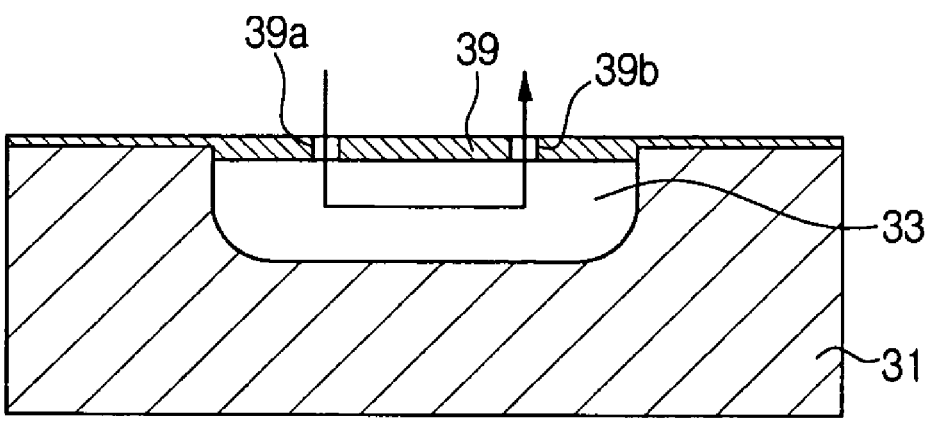
FIG. 9B shows an example in which the sealed fluidic channel is formed based on FIGS. 4A to 4D.

FIG. 9A shows an example in which a sealed fluidic channel is formed based on the embodiment 1, while FIG. 9B shows an example in which the sealed fluidic channel is formed based on the embodiment 2. Since the fluidic channel is also formed based on the embodiments 1 and 2, the same members as in the embodiments 1 and 2 have identical reference numerals, and description thereof will be omitted.

Referring to FIGS. 9A and 9B, cavities 4, 33 are formed in the substrates 1, 31, respectively, in accordance with the steps shown in FIGS. 3A to 3F and FIGS. 4A to 4D, and then cavities 4, 33 are sealed by membrane layers 11, 39. Thereafter, at least one inlet hole 11a, 39a and at least one outlet hole 11b, 39b is formed into membrane layer 11, 39 including porous layer 9, 38, respectively.

A typical process of manufacturing the sealed fluidic channel used in a BIO MEMS, and the like comprises forming a trench serving as a fluid passage on the substrate, and coupling it with the other substrate at its upper side, or in the case of forming the trench by wet etching a channel of undercut shape, where the channel is sealed by a thin film deposition technique. As described above, according to such conventional method, a problem resides in that the process for forming the fluidic channel is complicated.

Therefore, according to the present invention, it is possible to more simply produce the fluidic channel in comparison with the conventional technique.

The foregoing embodiment and advantages are merely exemplary and are not to be construed as limiting the present invention. The present teachings can be readily applied to other types of apparatuses. Also, the description of the embodiments of the present invention is intended to be illustrative, and not to limit the scope of the claims, and many alternatives, modifications, and variations will be apparent to those skilled in the art without departing from the spirit and scope of the invention as defined by the appended claims.

What is claimed is:

1. A method of manufacturing a MEMS structure which comprises
   forming a trench in a P-type silicon substrate;
   forming an oxide film on the substrate including a barrier by embedding the trench with the oxide film;
   removing the oxide film formed on the substrate, except for the barrier embedded in the trench;
   forming a mask layer on the substrate where the oxide film has been removed and removing a portion corresponding to an inside of the barrier;
   forming a porous layer having a predetermined thickness on the upper side of the substrate corresponding to the inside of the barrier;
   etching the substrate below the porous layer to form a cavity;
   removing the mask layer formed outside the barrier;
   sealing the upper side of the cavity with a membrane layer; and
   forming a resonator structure on the upper side of the membrane layer.

2. The method of claim 1, which comprises forming the trench by deep reactive ion etching.

3. The method of claim 1, which comprises forming the oxide film by thermal oxidation of the silicon substrate or by thin film deposition on the silicon substrate.

4. The method of claim 1, which comprises removing the oxide film by chemical mechanical polishing.

5. The method of claim 1, wherein the mask layer is formed of a silicon nitride film, deposited by chemical vapor deposition, and said etching comprises reactive ion etching.

6. The method of claim 1, which comprises forming the porous layer by immersing the P-type silicon substrate into a chemical solution to treat it electrochemically, and applying an electric current smaller than a critical current value.

7. The method of claim 1, which comprises forming the cavity by immersing the P-type silicon substrate into a chemical solution to treat it electrochemically, and applying an electric current larger than a critical current value.

8. The method of claim 1, wherein the membrane layer is formed of an insulating material.

9. The method of claim 8, wherein the membrane layer is formed of a material selected from the group consisting of an oxide film, a silicon nitride film and a polysilicon film.

10. The method of claim 9, which comprises forming the oxide film constituting the membrane layer by a thermal process or oxidation or thin film deposition, where the thin film deposition is chemical vapor deposition.

11. The method of claim 9, which comprises forming the silicon nitride film constituting the membrane layer by thin film deposition, where the thin film deposition is chemical vapor deposition.

12. The method of claim 9, which comprises forming the polysilicon film constituting the membrane layer by thin film deposition, where the thin film deposition is chemical vapor deposition or physical vapor deposition.

* * * * *